United States Patent
Schlott et al.

(10) Patent No.: US 6,372,104 B1
(45) Date of Patent: Apr. 16, 2002

(54) COBALT BASE ALLOY SPUTTERING TARGET WITH HIGH MAGNETIC FIELD PENETRATION

(75) Inventors: Martin Schlott, Hanau am Main; Josef Heindel, Hainburg, both of (DE)

(73) Assignee: Leybold Materials GmbH, Hanau (DE)

( * ) Notice: Subject to any disclaimer, the term of this patent is extended or adjusted under 35 U.S.C. 154(b) by 0 days.

(21) Appl. No.: 08/572,792

(22) Filed: Dec. 15, 1995

(30) Foreign Application Priority Data

Mar. 10, 1995 (DE) .......................... 195 08 535

(51) Int. Cl.[7] ............................................. C23C 14/34
(52) U.S. Cl. ................................ 204/298.13; 204/192.2
(58) Field of Search ..................... 204/192.15, 298.13, 204/192.2

(56) References Cited

U.S. PATENT DOCUMENTS

| | | | |
|---|---|---|---|
| 4,832,810 A | | 5/1989 | Nakamura et al. ...... 204/192.15 |
| 5,057,200 A | * | 10/1991 | Lal et al. .............. 204/192.2 X |
| 5,112,468 A | | 5/1992 | Weigert et al. ......... 204/298.13 |
| 5,149,409 A | * | 9/1992 | Ahlert et al. ............. 204/192.2 |
| 5,180,640 A | * | 1/1993 | Yamashita et al. ... 204/192.2 X |
| 5,282,946 A | * | 2/1994 | Kinoshita et al. ..... 204/192.2 X |
| 5,434,014 A | * | 7/1995 | Kanamaru et al. ... 204/192.2 X |
| 5,492,745 A | * | 2/1996 | Yokoyama ........... 204/192.2 X |
| 5,512,150 A | * | 4/1996 | Bourez et al. ........... 204/192.2 |
| 5,516,547 A | * | 5/1996 | Shimizu et al. ...... 204/192.2 X |
| 5,523,173 A | * | 6/1996 | Doerner et al. ...... 204/192.2 X |

OTHER PUBLICATIONS

Nakamura et al., IEEE Transactions on Magnetics, vol. MAG–18, pp. 1080–1082 (1982).
Kukla et al., IEEE Transactions on Magnetics, vol. MAG–23, pp. 137–139 (1987).

* cited by examiner

Primary Examiner—Nam Nguyen
(74) Attorney, Agent, or Firm—Fulbright & Jaworski L.L.P.

(57) ABSTRACT

A cobalt based alloy having a chromium content in the range of 18–21% permits a high degree of magnetic field penetration which is comparable to non-ferromagnetic alloys. The alloy preferably contains 8–18% Pt and optionally may contain small amounts of Mo, Pd, Ni, Ti, V, Ta, W, and B.

4 Claims, 1 Drawing Sheet

COBALT BASE ALLOY SPUTTERING TARGET WITH HIGH MAGNETIC FIELD PENETRATION

BACKGROUND OF THE INVENTION

The invention pertains to a target for sputtering with a magnetron cathode, the target consisting of a Co-base alloy with additives including Cr and at least one of the elements Pt, Pd, Ni, Ti, V, Ta, W, and B.

In the process of magnetron cathode sputtering, permanent magnets are installed behind the target (the cathode) to optimize the sputtering process. These magnets are arranged in such a way that a magnetic field forms in front of the target, i.e., in the discharge space. This magnetic field has the effect of localizing the discharge plasma. The area of the target surface over which the plasma is localized is subjected to more active sputtering, as a result of which an erosion pit is formed there.

In the case of ferromagnetic targets, there are two main problems which occur in this situation:

First, the magnetic flux of the permanent magnets is focused within the target, so that only a small amount of flux can penetrate into the discharge space. This problem therefore requires the use of very thin ferromagnetic targets.

Second, the local reduction in the cross section of the target (erosion pit) which occurs when cathodic sputtering is carried out with ferromagnetic targets has the effect of increasing the magnetic flux directly above the erosion pit. As a result, there is a local increase in ionization of the sputtering gas and also a local increase in the sputtering rate. The erosion pit therefore becomes very narrow, and this is associated with a very low rate of target material utilization.

Improved magnetic field geometries and higher magnetic field penetration can be achieved by means of complicated target designs. The magnetic resistance in the target can be increased and a larger field produced in the discharge space by providing the target with slots perpendicular to the direction of the magnetic field (K. Nakamura et al.: IEEE Transactions on Magnetics, Vol. MAG-18, pp. 1,080–1,082, 1982).

Kukla et al. (IEEE Transactions on Magnetics, Vol. MAG-23, pp. 137–139, 1987) describe a cathode for ferromagnetic materials, which consists of several individual targets, arranged in two planes one above the other, in order to obtain a stronger magnetic field. These designs are more expensive, however, and make the operation of magnetron cathode sputtering more difficult. U.S. Pat. Nos. 4,832,810 and 5,112,468 disclose targets for use in magnetron cathode sputtering systems in which the magnetic field penetration can be increased by providing the target with a hexagonal (0001) fiber structure perpendicular to its surface. This makes it possible to use targets with a greater original thickness and also leads to a better degree of utilization of the target material. The fiber texture is obtained by a cold working operation at temperatures below 400° C. It has been found, however, that alloys which contain other additives such as several at. % of Pt can no longer be cold-worked successfully at these low temperatures. The factor responsible for this is the insufficient ductility of the material, attributable to the presence of the alloying metals.

SUMMARY OF THE INVENTION

It is therefore the task of the present invention to create a target material based on CoPtCr alloys which has the largest possible magnetic field penetration when used in conjunction with magnetron cathodes.

This task is accomplished in accordance with the invention by a target alloy which contains 8–18 at. % Pt and 18–21 at. % Cr, so that the Curie temperature of the alloy, defined as the intersection of the high-temperature asymptote of the magnetization curve M(T) with the tangent to the area of steepest slope of the magnetization curve M(T), is below 80° C. In a preferred embodiment, a portion of the Cr content is replaced by an additional element R, such as Ta, W, Mo, Pd, Ti, V, Ni, or B. Favorable alloy contents are in the range of a few at. %.

In studies of the magnetization behavior of target alloys, it has been found that, in the case of some CoPtCr alloys, the Curie temperature $T_c$ is not very far above room temperature. In addition, $T_c$ is shifted to an unexpectedly pronounced degree as the Cr content increases:

$$\Delta T_c / \Delta Cr \approx -70(\pm 10)°\ C./at.\ \%$$

whereas the effect of the Pt content as well as that of the content of the other elements is at least an order of magnitude weaker.

With respect to alloys which contain just under 20–21 at. % of Cr, therefore, the unexpected possibility exists of being able, by increasing the Cr content slightly, to produce target alloys which, because of the width of the $T_c$ transition, are associated at room temperature with only an insignificant weakening of the magnetic field of the magnetron cathode. It will be desirable to vary the Cr content slightly as a function of the Pt, content and possibly as a function of the other elements as well. Layers produced from such targets still have good read/write properties as long as the Cr content does not exceed 21 at. %.

BRIEF DESCRIPTION OF THE DRAWINGS

FIG. 1 shows a graphic method for determining the Curie temperature from the temperature-dependent course of the magnetization process as measured with a magnetic balance. Tangent 5 is to be drawn to the point of the steepest slope of magnetization curve 6, and $T_c$ is found at intersection 7 of this tangent with the HT asymptote 8. With alloys according to the invention, a Curie temperature of less than 60° C. is possible.

The examples listed in Table 1 are intended to explain the invention in greater detail. All the test targets were produced by melting and casting the indicated quantitative proportions of the starting substances in steel molds. The castings were then hot-rolled and machined into disks with a diameter of 150 mm and a thickness of 6 mm.

Figure 1:
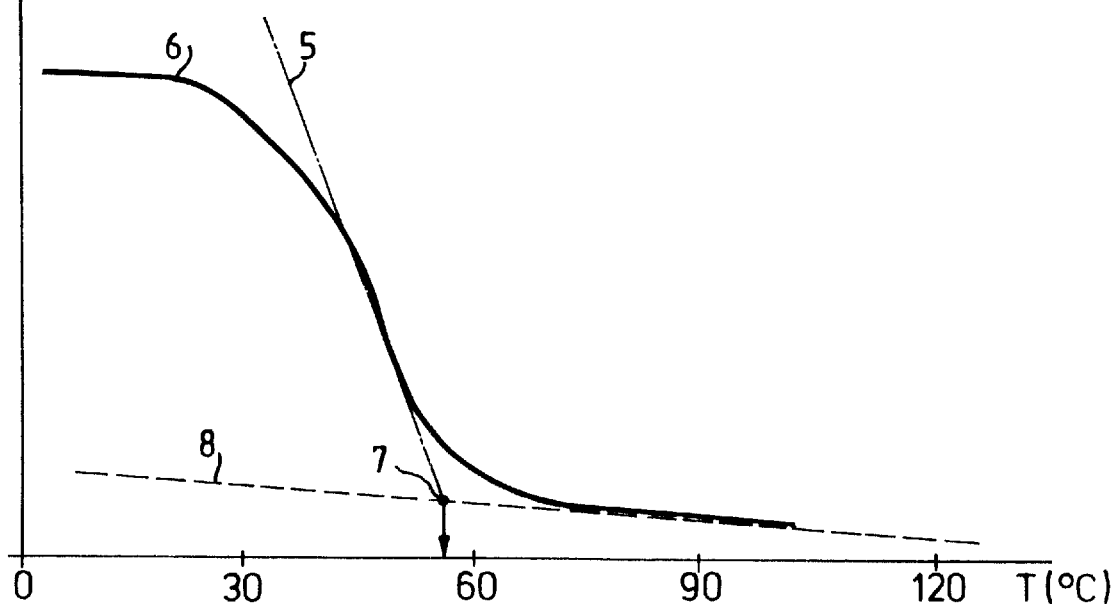
FIG. 1 shows a graphic method for determining the Curie temperature.
Figure 2:
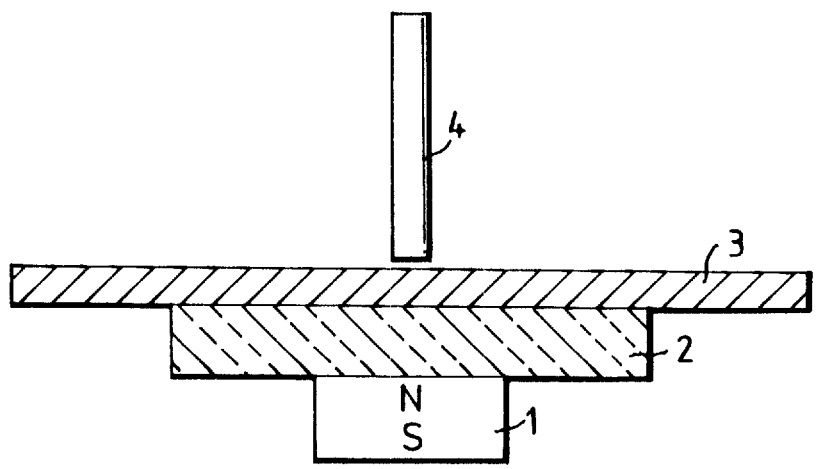
FIG. 2 shows the sputtering arrangement.

As a simple way of measuring the stray field above the target, a cylindrical magnet 1 was positioned under the center of target disk 3 in such a way that a field strength of 100–300 Oe was present above a 6-mm-thick nonmagnetic target. Then the target disks were studied; the field strength component Hz perpendicular to the plane of the target was measured by means of a Hall probe 4 directly over the target on the axis of symmetry of the target and the magnet. As FIG. 2 shows, Hall probe 4 is located opposite magnet 1, and a spacer 2 of nonmagnetic material and target disk 3 are arranged between magnet 1 and probe 4. The relative magnetic field penetration G is then determined as follows:

$$G = H_z\ (\text{target})/H_z\ (\text{without target})$$

TABLE 1

EXAMPLES OF ALTERNATIVE TARGET COMPOSITIONS ACCORDING TO THE INVENTION.

| Alloy (values in at. %) | | $T_c/°$ C. | $H_z$ (target)/ $H_z$ (without target) | Remarks |
|---|---|---|---|---|
| CoPt (9) | Cr (19.0) | 125 | 0.13 | Comparison Example |
| CoPt (9) | Cr (20.0) | 55 | 0.60 | According to the invention |
| CoPt (9) | Cr (20.5) | 15 | 0.98 | According to the invention |
| CoPt (13) | Cr (19.5) | 100 | 0.2 | Comparison Example |
| CoPt (13) | Cr (20.5) | 25 | 0.95 | According to the invention |
| CoPt (13) | Cr (21.0) | −15 | 0.99 | According to the invention |
| CoPt (9) | Cr (18) Ta (3) | −10 | 0.99 | According to the invention |

What is claimed is:

1. A target for sputtering with a magnetron cathode, the target consisting of a Co base alloy with addition of Cr, the alloy having a composition such that the Curie temperature of the alloy is below 80° C., and the alloy consisting of Co, 0–20 at. % Pt, 18–21 at. % Cr, and optionally R, wherein R stands for one or more elements selected from the group consisting of Mo, Pd, Ni, Ti, V, Ta, W, and B.

2. A target according to claim 1 wherein R is present in said alloy in the range of 0–3%.

3. A target according to claim 1 wherein the alloy consists of Co, 8–18 at. % Pt, and 19–21 at. % Cr.

4. A target according to claim 1 wherein the composition of the alloy is selected such that the Curie temperature of said alloy is below 60° C.

* * * * *

UNITED STATES PATENT AND TRADEMARK OFFICE
CERTIFICATE OF CORRECTION

PATENT NO.     : 6,372,104 B1
DATED          : April 16, 2002
INVENTOR(S)    : Schlott et al.

It is certified that error appears in the above-identified patent and that said Letters Patent is hereby corrected as shown below:

<u>Title page,</u>
Item [*] Notice, delete "0" and insert -- 1017 --.

Signed and Sealed this

First Day of July, 2003

JAMES E. ROGAN
*Director of the United States Patent and Trademark Office*